(12) United States Patent
Hannebauer (10) Patent No.: US 12,021,072 B2
(45) Date of Patent: Jun. 25, 2024

(54) METHOD OF MANUFACTURING OF ADVANCED THREE-DIMENSIONAL SEMICONDUCTOR STRUCTURES AND STRUCTURES PRODUCED THEREFROM

(71) Applicant: LUMIENSE PHOTONICS INC., Vancouver (CA)

(72) Inventor: Robert Steven Hannebauer, Vancouver (CA)

(73) Assignee: Lumiense Photonics Inc. (CA)

( * ) Notice: Subject to any disclaimer, the term of this patent is extended or adjusted under 35 U.S.C. 154(b) by 0 days.

(21) Appl. No.: 16/961,183

(22) PCT Filed: Jan. 22, 2019

(86) PCT No.: PCT/CA2019/000008
§ 371 (c)(1),
(2) Date: Jul. 9, 2020

(87) PCT Pub. No.: WO2019/144219
PCT Pub. Date: Aug. 1, 2019

(65) Prior Publication Data
US 2021/0057403 A1    Feb. 25, 2021

Related U.S. Application Data

(60) Provisional application No. 62/620,893, filed on Jan. 23, 2018.

(51) Int. Cl.
*H01L 25/00* (2006.01)
*H01L 21/768* (2006.01)
(Continued)

(52) U.S. Cl.
CPC ........ *H01L 25/50* (2013.01); *H01L 21/76898* (2013.01); *H01L 23/481* (2013.01);
(Continued)

(58) Field of Classification Search
CPC . H01L 25/18; H01L 23/481; H01L 21/76898; H01L 25/0657; H01L 25/50;
(Continued)

(56) References Cited

U.S. PATENT DOCUMENTS 6,905,557 B2 *  6/2005  Enquist ................... H01L 23/36
                                                     257/E21.705
6,984,571 B1    1/2006  Enquist
(Continued)

FOREIGN PATENT DOCUMENTS

WO    2014/110013    7/2014

OTHER PUBLICATIONS

International Search Report for PCT/CA2019/000008—Method of Manufacturing of Advanced Three-Dimensional Semiconductor Structures and Structures Produced Therefrom.
Written Opinion for PCT/CA2019/000008—Method of Manufacturing of Advanced Three-Dimensional Semiconductor Structures and Structures Produced Therefrom.
(Continued)

*Primary Examiner* — Jasmine J Clark
(74) *Attorney, Agent, or Firm* — Voyer Law (57) ABSTRACT

A method of interconnecting metallic structures in the manufacture of a three-dimensional semiconductor is provided, the method comprising providing a first upper surface of a first substrate and a second upper surface of a second substrate with a bonding layer; bonding the first upper surface to the second upper surface to provide a bond; etching a via through a lower surface of the first substrate, through the first substrate, around a first metallic structure embedded in the first substrate, through the bond and to a second metallic structure embedded in the second substrate; and filling the via with a conductive material to provide a via structure, thereby electrically connecting the metallic structures.

23 Claims, 7 Drawing Sheets

(51) Int. Cl.
*H01L 23/00* (2006.01)
*H01L 23/48* (2006.01)
*H01L 25/065* (2023.01)

(52) U.S. Cl.
CPC .............. *H01L 24/32* (2013.01); *H01L 24/83* (2013.01); *H01L 25/0657* (2013.01); *H01L 2224/32145* (2013.01); *H01L 2224/83896* (2013.01); *H01L 2225/06541* (2013.01)

(58) Field of Classification Search
CPC ................ H01L 24/80; H01L 24/08; H01L 2225/06541; H01L 24/02; H01L 2224/83894; H01L 24/83; H01L 2224/32145; H01L 24/24; H01L 24/32; H01L 25/065; H01L 25/0652; H10B 80/00
USPC ......................................................... 438/107
See application file for complete search history.

(56) References Cited

U.S. PATENT DOCUMENTS

| 8,492,878 | B2 | 7/2013 | Farooq et al. | |
|---|---|---|---|---|
| 9,741,694 | B2 | 8/2017 | Yu et al. | |
| 2014/0191418 | A1* | 7/2014 | Cheng | H01L 24/83 |
| | | | | 257/777 |
| 2015/0021789 | A1* | 1/2015 | Lin | H01L 25/0657 |
| | | | | 257/774 |
| 2016/0204084 | A1 | 7/2016 | Lin | |
| 2017/0062366 | A1 | 3/2017 | Ziptronix et al. | |
| 2017/0194291 | A1 | 7/2017 | Yu et al. | |
| 2017/0316971 | A1 | 11/2017 | Ziptronix et al. | |
| 2018/0102251 | A1 | 4/2018 | Delacruz et al. | |

OTHER PUBLICATIONS

Y. H. Hu et al., "Cu—Cu hybrid bonding as option for 3D IC stacking," 2012 IEEE International Interconnect Technology Conference, San Jose, CA, 2012, pp. 1-3, doi: 10.1109/IITC.2012.6251571.

* cited by examiner

METHOD OF MANUFACTURING OF ADVANCED THREE-DIMENSIONAL SEMICONDUCTOR STRUCTURES AND STRUCTURES PRODUCED THEREFROM

CROSS REFERENCE TO RELATED APPLICATIONS

The present invention claims the benefit of U.S. Patent Application Ser. No. 62/620,893, filed on Jan. 23, 2018 and entitled APPARATUS AND METHOD FOR INTERCONNECTION OF LAYERS IN ADVANCED 3D SEMICONDUCTOR STRUCTURES, which is hereby incorporated in its entirety including all tables, figures, and claims.

FIELD

The present technology is directed to a method of interconnecting layers during the manufacturing of three-dimensional (3D) semiconductor structures. More specifically, it is a new application of existing techniques to simplify the manufacturing of the interconnection between bonded device layers, to provide highly accurate alignment, to provide a very high microelectronic element to connection ratio and to allow multiple layers to be transferred and interconnected.

BACKGROUND

Semiconductor manufacturing processes for 3D integration of multiple layers of isolated silicon substrates may use a variety of techniques for integration and interconnection of layers between substrates, such as bump bonding and Through-Silicon-Vias (TSV). These techniques require a highly reliable method for interconnection between the metal layers in the stack of semiconductor layers. Additionally, these metal layers reside at different depths in the stack, thus complicating interconnection—most semiconductor processes are planar processes and usually involve only the most recently applied layer.

One approach is disclosed in https://ieeexplore.ieee.org/document/6251571 where it is disclosed that Cu—Cu bonding is seen as possible option to enable 3D-IC integration within a reasonable cost. In case of 3D stacking, the TSVs can be revealed (nails) at wafer back side and bonded directly on a Cu landing pad. This can offer small pitch IOs (which are in the range of at least 10 μm) and save the cost of extra processing like RDL (Re-Distribution Layer) and bumping. In this work they present the results achieved by developing the process for TSV nail reveal in order to enable electrical yielding Cu—Cu thermal compression bonding (TCB). Thus, they have investigated the impact on different TSV nail structures under various TCB conditions for a minimum TSV pitch of 10 μm. Three different TSV nail structures have been defined: No Nail exposed, Flat Surface of TSV, and Dome Shape of TSV (refer to FIG. 1). TSVs with different height (2 um and 5 um) are also been generated in case of dome shape. They initially report the results achieved on the different structures in case of different bonding conditions. Later they focused on the best performing structures and demonstrate that the use of an underfill (UF) is necessary to ensure good adhesion between dies. The back of the donor wafer is attached to the front of the mount wafer. The TSV are large, ranging in size from 5 μm to 100 μm and the wafers are thick. Pixels are about 1 μm to about 10 μm. The interconnections block light and therefore cannot be used in a pixel array. Back grinding is also problematic process as it is costly to grind through approximately 700 μm of wafer and grinding using the Cu nail as a grinding stop will necessarily involve mixing the Si and Cu. Cu is a contaminant in Si and has a high solid mobility and solid solubility.

United States Patent Application 20180102251 discloses direct-bonded native interconnects and active base dies. In a microelectronic architecture, active dies or chiplets connect to an active base die via their core-level conductors. These native interconnects provide short data paths, which forgo the overhead of standard interfaces. The system saves redistribution routing as the native interconnects couple in place. The base die may contain custom logic, allowing the attached dies to provide stock functions. The architecture can connect diverse interconnect types and chiplets from various process nodes, operating at different voltages. The base die may have state elements for drive. Functional blocks aboard the base die receive native signals from diverse chiplets, and communicate with all attached chiplets. The chiplets may share processing and memory resources of the base die. Routing blockages are minimal, improving signal quality and timing. The system can operate at dual or quad data rates. The architecture facilitates ASIC, ASSP, and FPGA ICs and neural networks, reducing footprint and power requirements. This speaks to the assembly of individual dies onto a single parent die, much like early hybrid modules. Simply put it is an adaptation of the direct bonding interconnect concept to a multiple and heterogenous mixture of dies on top of the base (larger) die. This system is inherently limited in the number of layers that can be subsequently layered together to only two layers, it does not provide interconnects through the donor dies to subsequent connections and layers and because of methods of placements by necessity these interconnects between the base die and chiplets while being smaller than usual die level to board level interconnects will still be on the order of at least 10 μms.

United States Patent Application 20170194291 discloses a semiconductor structure and a method for forming the same. The method comprises: providing a first semiconductor workpiece; bonding a second semiconductor workpiece to a first surface of the first semiconductor workpiece; forming a first electrically conductive via through the second semiconductor workpiece to the first semiconductor workpiece; bonding a third semiconductor workpiece to a second surface of the first semiconductor workpiece, the second surface being opposite to the first surface; and forming a second electrically conductive via through the first semiconductor workpiece and the third semiconductor workpiece to the second semiconductor workpiece such that the first electrically conductive via and the second electrically conductive via are electrically connected. This method requires that metal pads are formed on the semiconductor surfaces to electrically connect the conductive via to each semiconductor. There is no self-alignment. There is also no flexibility in terms of via structures selectively interconnecting contact structures in different wafers. There is not direct bonding of wafers and in particular there is an emphasis on having a gap between the wafers/dies and having a filling layer. By necessity then this is a technique for die "stacking" to gain the advantages of lower capacitance of interconnect and greater density of die. This applies to the use of TSVs and Bump bonding so is in connect of thick die and larger interconnect structures on the order of 10-100 μm.

United States Patent Application 20170316971 discloses a method of three-dimensionally integrating elements such as singulated die or wafers and an integrated structure having connected elements such as singulated dies or wafers. Either or both of the die and wafer may have semiconductor devices formed therein. A first element having a first contact structure is bonded to a second element having a second contact structure. First and second contact structures can be exposed at bonding and electrically interconnected as a result of the bonding. A via may be etched and filled after bonding to expose and form an electrical interconnect to interconnected first and second contact structures and provide electrical access to this interconnect from a surface. The via structures are large. There is no self-alignment. There is also no flexibility in terms of via structures selectively interconnecting contact structures in different wafers.

United States Patent Application 20170062366 discloses a method for forming a direct hybrid bond and a device resulting from a direct hybrid bond including a first substrate having a first set of metallic bonding pads, preferably connected to a device or circuit, capped by a conductive barrier, and having a first non-metallic region adjacent to the metallic bonding pads on the first substrate, a second substrate having a second set of metallic bonding pads capped by a second conductive barrier, aligned with the first set of metallic bonding pads, preferably connected to a device or circuit, and having a second non-metallic region adjacent to the metallic bonding pads on the second substrate, and a contact-bonded interface between the first and second set of metallic bonding pads capped by conductive barriers formed by contact bonding of the first non-metallic region to the second non-metallic region. The interconnections penetrate the mounting interface prior to bonding. The via structures are limited in size to about 1 µm and they are limited in number because of yield. There is one connection per 4 microelectronic element. This process is limited to bonding of two wafers and does not permit bonding of subsequent wafers.

United States Patent Application 20160204084 discloses methods for forming a semiconductor device structure. The method includes providing a first semiconductor wafer and a second semiconductor wafer. A first transistor is formed in a front-side of the first semiconductor wafer, and no devices are formed in the second semiconductor wafer. The method further includes bonding the front-side of the first semiconductor wafer to a backside of the second semiconductor wafer and thinning a front-side of the second semiconductor wafer. After thinning the second semiconductor wafer, a second transistor is formed in the front-side of the second semiconductor wafer. At least one first TSV is formed in the second semiconductor wafer, and the first TSV directly contacts a conductive feature of the first semiconductor wafer. This process is limited to bonding of two wafers and does not permit bonding of subsequent wafers.

As can be understood from the foregoing, current 3D integration methods often process the individual device layers separately and then assemble the layers. This can result in differences in errors between the separate layers in addition to errors in alignment of these layers to each other during the assembly process. The whole process is complicated by the need to connect between two different metal wire layers buried underneath a device layer. A further complication may arise when trying to make those buried signals available at the top surface of the assembly.

What is needed is a new manufacturing method that allows for the assembly of device layers such that they are aligned with a high degree of accuracy. It would be preferable if the method applied known techniques in a new way, so as to make adoption of the method more likely. It would be preferable if the via structures could be 0.22 µm or smaller and were not limited in number. It would be further advantageous if there could be one connection per microelectronic element. It would be of further advantage if the connections penetrated the mounting interface after bonding. It would be of further advantage of the method provided self-alignment. It would be of further advantage if via structures selectively interconnect contact structures in different wafers.

SUMMARY

The present technology provides a new manufacturing method that allows for the assembly of device layers such that they are aligned with a high degree of accuracy. The method results in increased yield and reliability. The via structures are 0.22 µm or smaller and are not limited in number. There can be very high interconnection concentration, thus the semiconductors devices produced are well suited for use in imaging since there can be more than one connection per pixel. The connections penetrate the mounting interface after bonding. The method is a self-aligning method. Via structures can be selectively interconnected to via structures in different wafers, for example, one via structure may interconnect a via structure in a first wafer with a via structure in a second wafer while an adjacent via structure may interconnect a third via structure in a third wafer with both the via structure in the first wafer and the via in the second wafer.

In one embodiment, a method of interconnecting metallic structures in the manufacture of a three-dimensional semiconductor is provided, the method comprising providing a first upper surface of a first substrate and a second upper surface of a second substrate with a bonding layer; bonding the first upper surface to the second upper surface to provide a bond; etching a via through a lower surface of the first substrate, through the first substrate, around a first metallic structure embedded in the first substrate, through the bond and to a second metallic structure embedded in the second substrate; and filling the via with a conductive material to provide a via structure, thereby electrically connecting the metallic structures.

The method may further comprise an etch stop in the first metallic structure protecting a conductive layer in the first metallic structure from being etched.

The method, may further comprise an etch stop in the second metallic structure stopping the etching in the second substrate.

In the method, the etching may provide a via of less than about 500 nanometres in diameter. The method may further comprise bonding a third substrate to the lower surface of the first substrate to provide a second bond.

The method may further comprise etching a second via through the third substrate, around a third metallic structure embedded in the third substrate, and through the second bond to the via structure.

The method may further comprise filling the second via with a conductive material to extend the via structure, thereby electrically connecting the metallic structures.

The method may further comprise sequentially bonding, etching a via and filling the via in a fourth and subsequent substrates, thereby providing a three-dimensional semiconductor of nth substrates.

In the method, the method may be conducted at room temperature.

In the method, the bonding may be oxide bonding.

In another embodiment, a method of connecting substrates in the manufacture of a three-dimensional semiconductor is provided, the method comprising: selecting a first substrate with a first upper surface and a first metallic structure below the first upper surface; selecting a second substrate with a second upper surface and a second metallic structure below the second upper surface, the first and the second metallic structures comprising a conductive layer proximate the upper surfaces and an etching stop distal to the upper surfaces; providing the first upper surface and the second upper surface with a bonding layer; bonding the bonding layers to provide a bond; etching a via through a lower surface of the first substrate, through the first substrate, around the first metallic structure, through the bond and to the second metallic structure; and filling the via with a conductive material to provide a via structure.

In the method, the etching may produce vias of less than about 750 nm in diameter.

In the method, the etching may produce vias of less than about 250 nm in diameter.

The method may further comprise bonding a third substrate to the lower surface of the first substrate to provide a second bond.

The method may further comprise etching a second via through the third substrate, around a third metallic structure embedded in the third substrate, and through the second bond to the via structure.

The method may further comprise filling the second via with a conductive material to extend the via structure, thereby electrically connecting the metallic structures.

The method may further comprise etching a plurality of vias in the substrates and filling the plurality of vias with the conductive material.

In the method, the etching may produce the plurality of vias at a concentration of about one via per microelectronic element.

In another embodiment, a method of forming a three-dimensional semiconductor structure is provided, the method comprising: selecting a first silicon wafer which includes a first device layer and a back-end-of-line (BEOL) layer, the BEOL layer including a first upper surface and a first metal stack, the first metal stack including a conductive layer proximate the first upper surface and an etching stop distal to the first upper surface, the first upper surface provided with an oxide layer; selecting a transfer layer which includes a second device layer and a second BEOL layer, the second BEOL layer including a second upper surface and a second metal stack, the second metal stack including a conductive layer proximate the second upper surface and an etching stop distal to the second upper surface, the second upper surface provided with an oxide layer; bonding the first silicon wafer to the transfer layer with the oxide layers, such that the first upper surface faces the second upper surface; etching a plurality of vias through the transfer layer into the first BEOL layer to a depth of the first metal stack; filling the vias with a conductive material to provide an electrical connection between the first and the second metal stacks, thereby forming a three-dimensional semiconductor structure.

In the method, the first silicon wafer may be selected to have the first metal stack about 5 nm from the first upper surface and the transfer layer may be selected to have the second metal stack about 5 nm from the second upper surface.

The method may further comprise etching a plurality of vias in the substrates and filling the plurality of vias with the conductive material.

In the method, the etching may produce the plurality of vias at a concentration of about one via per microelectronic element.

In the method, the etching may produce vias of less than about 250 nanometres in diameter.

DESCRIPTION

Except as otherwise expressly provided, the following rules of interpretation apply to this specification (written description and claims): (a) all words used herein shall be construed to be of such gender or number (singular or plural) as the circumstances require; (b) the singular terms "a", "an", and "the", as used in the specification and the appended claims include plural references unless the context clearly dictates otherwise; (c) the antecedent term "about" applied to a recited range or value denotes an approximation within the deviation in the range or value known or expected in the art from the measurements method; (d) the words "herein", "hereby", "hereof", "hereto", "hereinbefore", and "hereinafter", and words of similar import, refer to this specification in its entirety and not to any particular paragraph, claim or other subdivision, unless otherwise specified; (e) descriptive headings are for convenience only and shall not control or affect the meaning or construction of any part of the specification; and (f) "or" and "any" are not exclusive and "include" and "including" are not limiting. Further, the terms "comprising," "having," "including," and "containing" are to be construed as open-ended terms (i.e., meaning "including, but not limited to,") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. Where a specific range of values is provided, it is understood that each intervening value, to the tenth of the unit of the lower limit unless the context clearly dictates otherwise, between the upper and lower limit of that range and any other stated or intervening value in that stated range, is included therein. All smaller sub ranges are also included. The upper and lower limits of these smaller ranges are also included therein, subject to any specifically excluded limit in the stated range.

Unless defined otherwise, all technical and scientific terms used herein have the same meaning as commonly understood by one of ordinary skill in the relevant art. Although any methods and materials similar or equivalent to those described herein can also be used, the acceptable methods and materials are now described.

Figure 1A:
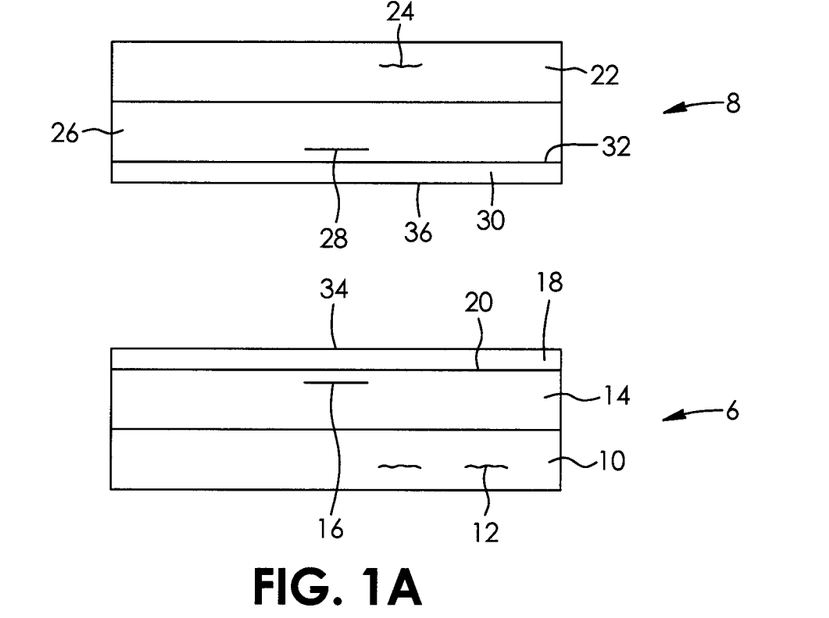
FIG. 1A is a side view of a mount wafer and a transfer layer wafer of the present technology.
Figure 1B:
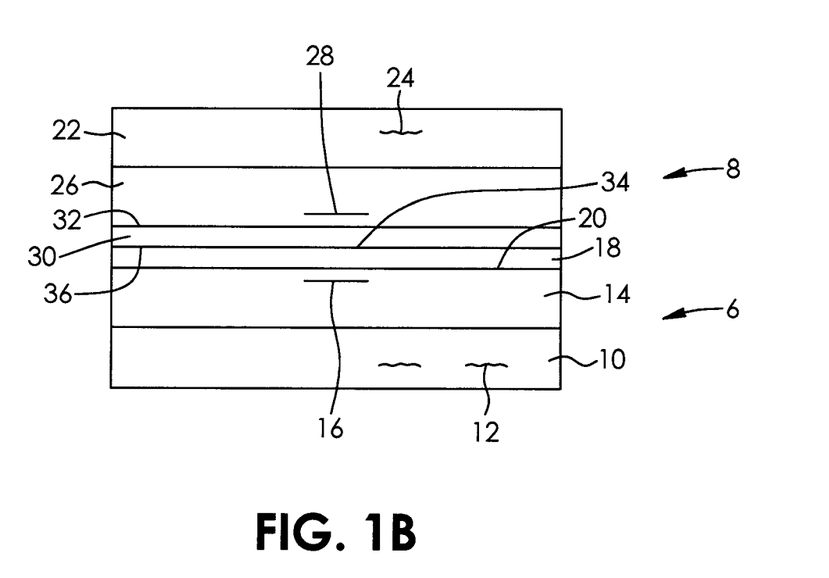
FIG. 1B is a side view of the mount wafer and the transfer layer wafer bonded to one another to provide a semiconductor structure.

As shown in FIG. 1A, a silicon mount wafer, generally referred to as 6, includes a first device transfer layer 10 which includes first front-end-of-line ("FEOL") structures 12 (microelectronic elements), for example, but not limited to transistors, photo diodes (pixels), microelectronic mechanical systems (MEMS), diodes, resistors, capacitors, inductors, silicon photonics devices, or other suitable elements and a first back-end-of-line (BEOL) layer 14, which includes a first metal stack 16, which may be, for example, but not limited to metal wiring embedded in a dielectric. A first dielectric layer 18, which in the preferred embodiment is a high-density oxide layer and most preferably is a high quality silicon dioxide layer, (but can be, for example, but not limited to, silicon nitride, silicon oxynitride (SION), tantalum oxide) is deposited on a first surface 20 of the silicon mount wafer 6. The silicon mount wafer 6 is usually a full thickness complementary metal-oxide-semiconductor (CMOS) wafer and provides mechanical support for the final assembly of transferred layers. The silicon transfer layer wafer, generally referred to as 8, includes a second device layer 22 which includes second front-end-of-line ("FEOL") structures 24 (microelectronic elements) for example, but not limited to transistors, diodes, resistors, capacitors, inductors, or other suitable elements and a second back-end-of-line (BEOL) layer 26, which includes a second metal stack 28, which may be, for example, but not limited to, metal wiring. A second dielectric layer 30, which is preferably a high density oxide layer which matches the first dielectric layer 18 in density and porosity and which in the preferred embodiment is a high density oxide layer and most preferably is a high quality silicon dioxide layer (but can be, for example, but not limited to, silicon nitride, silicon oxynitride (SION), tantalum oxide), is deposited on a first surface 32 of the silicon transfer layer wafer 8. The first and second dielectric layers 18, 30 are silicon dioxide layers. Both the mount wafer 6 and the transfer layer wafer 8 have a high degree of flatness and a low level of roughness on their first surfaces 20, 32. The first and second dielectric layers 18, 30 are necessarily also flat with little or no roughness on their surfaces 34, 36. The first and second dielectric layers 18, 30 are processed to ensure that the flatness and roughness for good bonding is met. This may not be inherent in the first and second dielectric layers 18, 30. Illustrative values for wafer bow are less than 70 μm across a 200 mm wafer with a local surface roughness of approximately 0.2 nm. As can be seen, the first and second metal stacks 16, 28 are buried within the first and second BEOL 14,26. They may be at different depths. As shown in FIG. 1B, in the first manufacturing step, the silicon mount wafer 6 and the silicon transfer layer wafer 8 are bonded to one another by the dielectric layers 18, 30, which are covalently bonded to form a first bond interface 38. Alternatively, bonding can be fusion bonding, hybrid bonding, eutectic bonding, adhesive bonding, thermo-compression bonding, or plasma activated bonding. Bonding is done at room temperature or at temperatures that do not exceed failures limits of the BEOL stacks of the transferred layers. Once the mount wafer 6 and the transfer layer wafer 8 are bonded, the mount wafer 6 is thinned using the methodology of U.S. Pat. No. 7,166,520, which is incorporated herein in its entirety by reference. In brief, the silicon mount wafer 6 includes a hydrogen platelet region that is parallel to the surface of the wafer. This is a cleave plane and when a force is applied, the wafer fractures along the plane, reducing the thickness of the wafer to a highly controlled thickness using known techniques such as polishing and Tungsten Chemical Mechanical Planarization (CMP).

Figure 2:
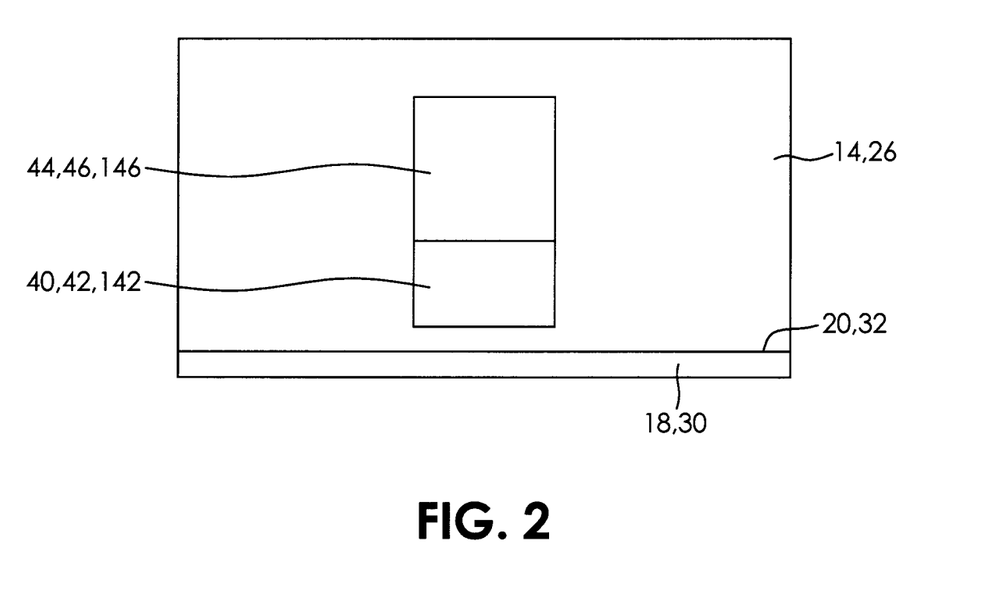
FIG. 2 is a side view of the metal stack of the transfer wafer and the transfer layer wafer of FIGS. 1A and 1B.

The details of the metal stacks 16, 28, 88 and their orientations are shown in FIG. 2. The metal stacks 16, 28, 88 are comprised of a conductive layer 40, 42, 142 which may be, for example, but not limited to aluminum or copper and an etch stop 44, 46, 146 which may be, for example, but not limited to a stack of titanium, titanium nitride and tungsten. The conductive layers 40, 42, 142 are proximate the first surfaces 20, 32 and the etch stops 44,46, 146 are distal to the first surfaces 20, 32. In the preferred embodiment, the conductive layer 40, 42, 142 are no more than about 500 nm to about 100 nm and preferably about 5 nm from the first surfaces 20,32. As the silicon mount wafer 6 and the silicon transfer layer wafer 8 are sandwiched together such that the silicon transfer layer wafer 8 is flipped, the etch stop 46 is above the conductive layer 42 in the silicon transfer layer wafer 8 and is below the conductive layer 40 in the silicon wafer 6. The etch stop 44, 46, 146 is also known as a protective layer. If a second transfer layer wafer is added, it is placed on the first transfer layer wafer 8, in the same orientation as the first transfer layer wafer 8.

Figure 3:
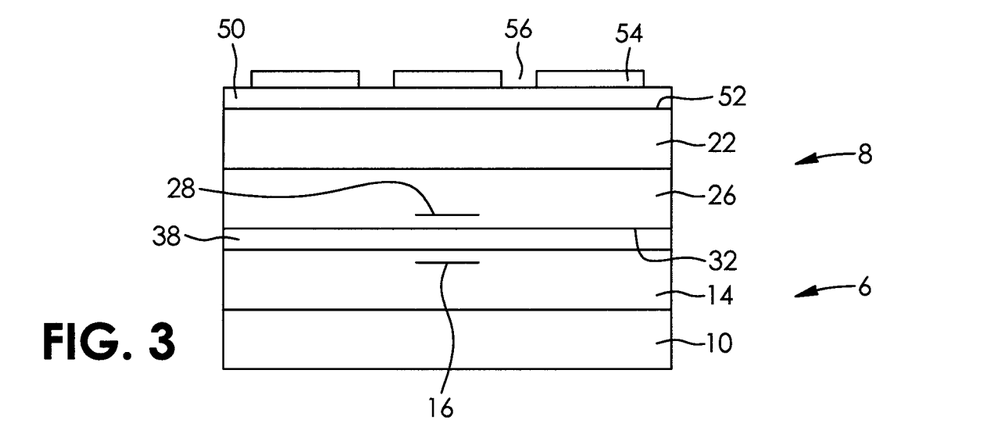
FIG. 3 is a side view of the semiconductor structure in preparation for etching.

As shown in FIG. 3, in the second manufacturing step, a third dielectric layer 50, which is preferably a high quality oxide layer, and most preferably is silicon dioxide but may be other dielectric layers as described above, is added to the second surface 52 of the transfer layer wafer 8 and a patterned photoresist 54, with apertures 56 is placed overtop of the first dielectric layer 50. The patterned photoresist 54 ensures that etching only occurs where the apertures 56 are located.

Figure 4A:
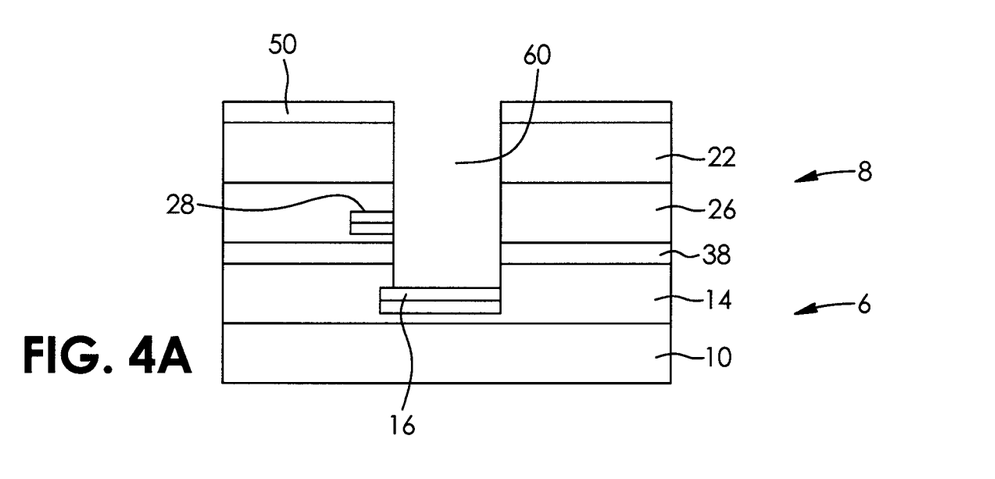
FIG. 4A is a side view of the semiconductor structure after etching to provide a via.
Figure 4B:
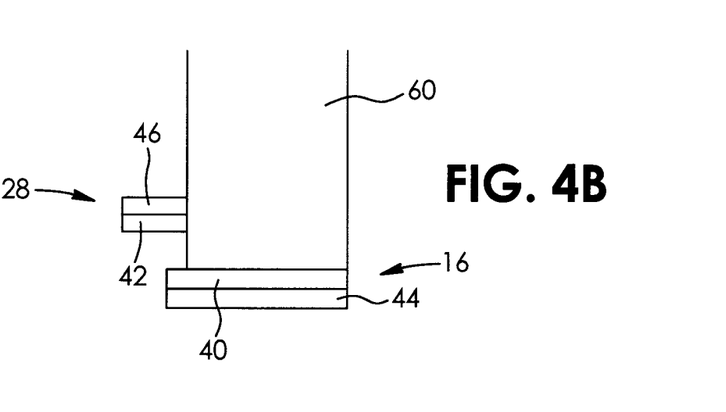
FIG. 4B is a side view of the details of the via and the metal stacks.

As shown in FIG. 4A, a via 60 is etched and extends through the third dielectric layer 50, through the transfer layer wafer 8, through the first bond interface 38 and into the first BEOL layer 14 of the silicon mount wafer 6. As shown in FIG. 4B, the etch stop 46 of the second metal stack 28 acts as a barrier to etching of the conductive layer 42, thus allowing the conductive layer 42 to maintain its integrity. The etching proceeds past the second metal stack 28 and to the first metal stack 16, exposing the conductive layers 40, 42 to one another. This, therefore, self-aligns the conductive layers 40, 42 in a single etch step. Any suitable etching method may be used including, for example, plasma etch, reactive ion plasma etch (RIE), a chemical wet etch, a laser drill, and/or other processes known in the art. The etching process may result in a via having a vertical sidewall profile or a tapered sidewall profile or an irregular profile, such as including a foot. The via 60 has a high aspect ratio, which may be between approximately 5 and approximately 10 or greater than 10.

Figure 5:
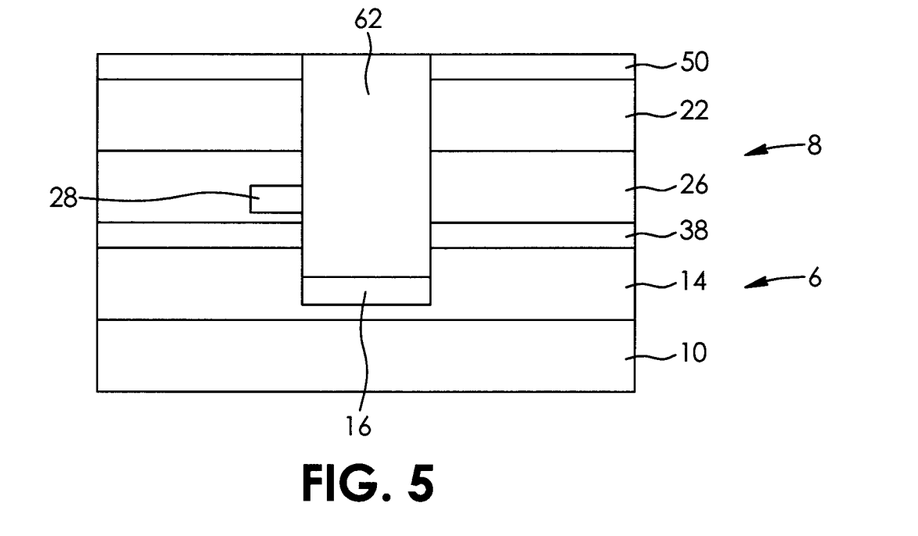
FIG. 5 is a side view of the semiconductor structure with the via filled to provide a via structure.

FIG. 5 shows the next step in the method. Conductive material is deposited in the via 60 to form a via structure 62 or interconnection, thereby electrically interconnecting the conductive layers 40, 42, 142 to one another. The conductive material may be formed of tungsten, tungsten-based alloy, titanium, copper, or copper-based alloy, aluminum, gold, silver, molybdenum (Mo), titanium nitride (TiN), and the like. In the preferred embodiment, titanium, titanium nitride and tungsten are used and the via structure 62 is processed using a Tungsten Chemical Mechanical Planarization ("CMP") process. Those skilled in the art would recognize that once the via structure 62 is established, there is electrical contact to the silicon in the second device layer 22 through the second metal stack 28. Sometimes this contact is desired, and sometimes electrical isolation will be required.

Figure 6:
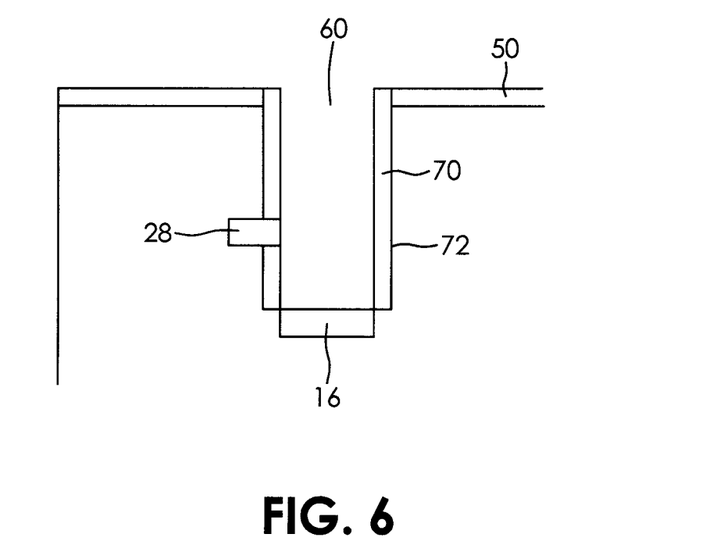
FIG. 6 is a side view of the preferred embodiment with the via being lined with an insulating layer.

In the preferred embodiment, shown in FIG. 6, a dielectric isolation layer 70 is on the sidewalls 72 of the via 60. During the preparation of the silicon transfer layer wafer 8, trenches are cut through the second device layer 22 and the trenches are filled with a dielectric such as an oxide. The via 60 is smaller than the dielectric-filled trench, thus providing the dielectric isolation layer 70.

Figure 7A:
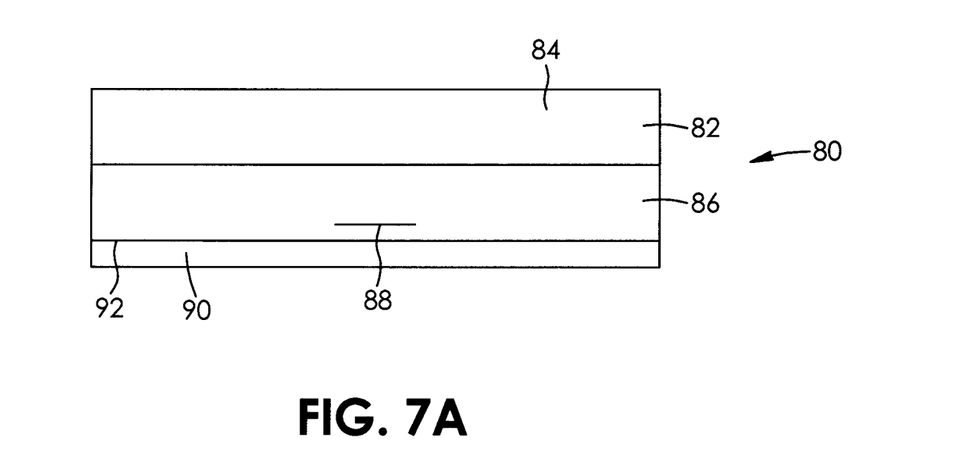
FIG. 7A is a side view of a second transfer wafer.
Figure 7B:
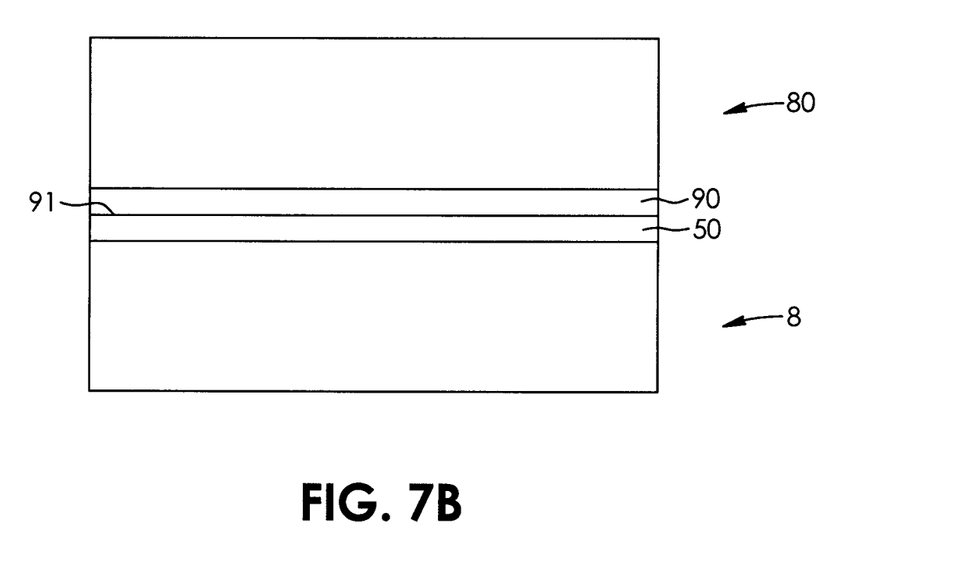
FIG. 7B shows the second transfer wafer bonded to the first transfer wafer to provide a second semiconductor structure.
Figure 8:
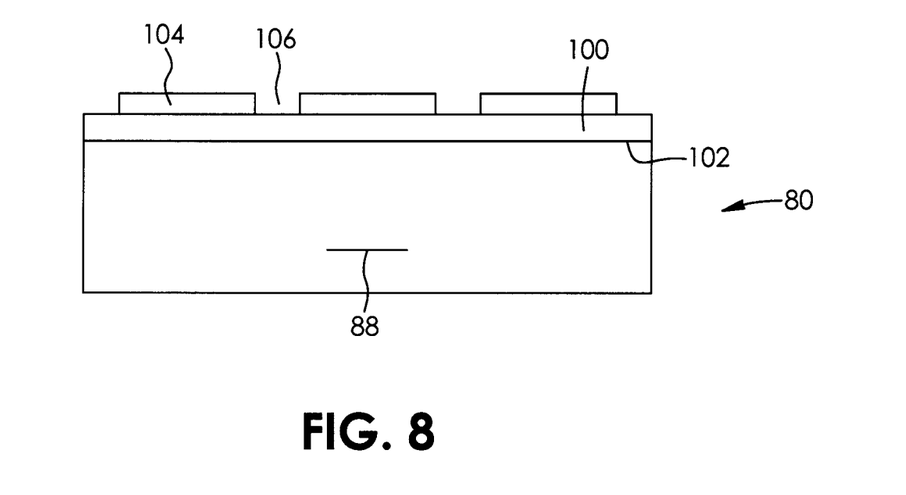
FIG. 8 is a side view of the second semiconductor structure in preparation for etching.

In an additional step, shown in FIG. 7A, a second transfer layer wafer, generally referred to as 80 is added. The second transfer layer wafer 80 includes a third device layer 82 which includes second front-end-of-line ("FEOL") structures 84 (microelectronic elements) for example, but not limited to transistors, diodes, resistors, capacitors, inductors, or other suitable elements and a third back-end-of-line (BEOL) layer 86, which includes a third metal stack 88, which may be, for example, but not limited to, metal wiring. A fourth dielectric layer 90 is grown on a first surface 92 of the second transfer layer wafer 80. The fourth dielectric layer 90 is preferably a high quality oxide layer and most preferably is silicon dioxide but may be other dielectric layers as described above. As shown in FIG. 7B, the fourth dielectric layer 90 bonds with the dielectric layer 50 to form a second bond interface 91. As described above and shown in FIG. 8, a fifth dielectric layer 100 is added to the second surface 102 of the second transfer layer wafer 80 and a photoresist 104, with apertures 106 is placed over the top of the second dielectric layer 100. The photoresist 104 ensures that etching only occurs where the apertures 106 are located. The third metal stack 88 is described above and as shown in FIGS. 7A and 8.

Figure 9:
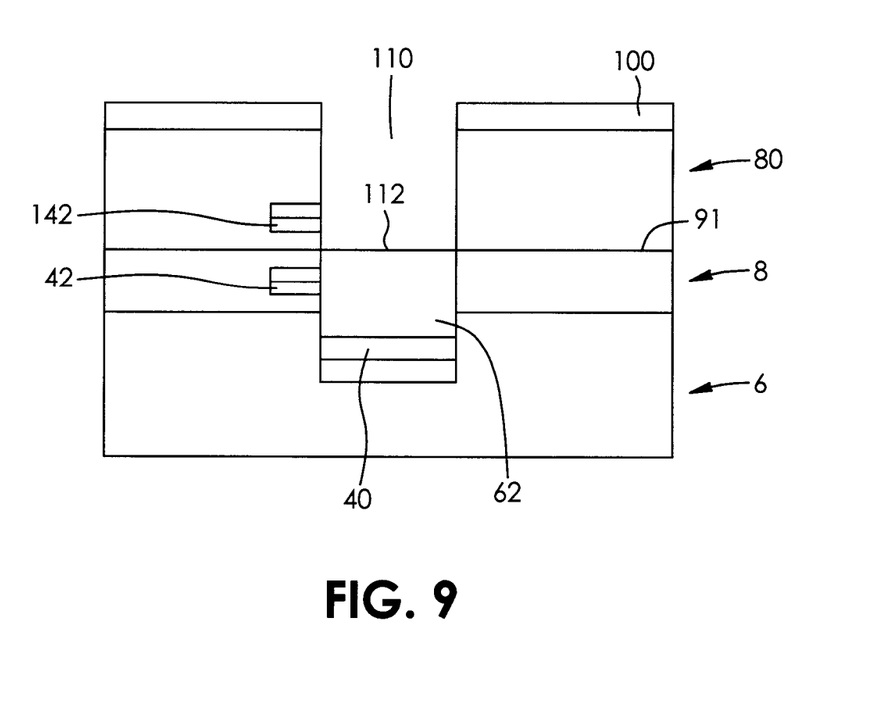
FIG. 9 is a side view of the second semiconductor structure after etching to provide a second via.

As shown in FIG. 9, a via 110 is etched and extends through the fifth dielectric layer 100, through the second transfer layer wafer 80, through the second bond interface 91 to the upper surface 112 of the first via structure 62. The etch stop 146 of the third metal stack 88 acts as a barrier to etching of the conductive layer 142, thus allowing the conductive layer 142 to maintain its integrity. The etching proceeds past the third metal stack 88 and to the first via structure 62, exposing the conductive layer 142 to the first via structure 62. This, therefore, self-aligns the conductive layers 40, 42, 142.

Figure 10:
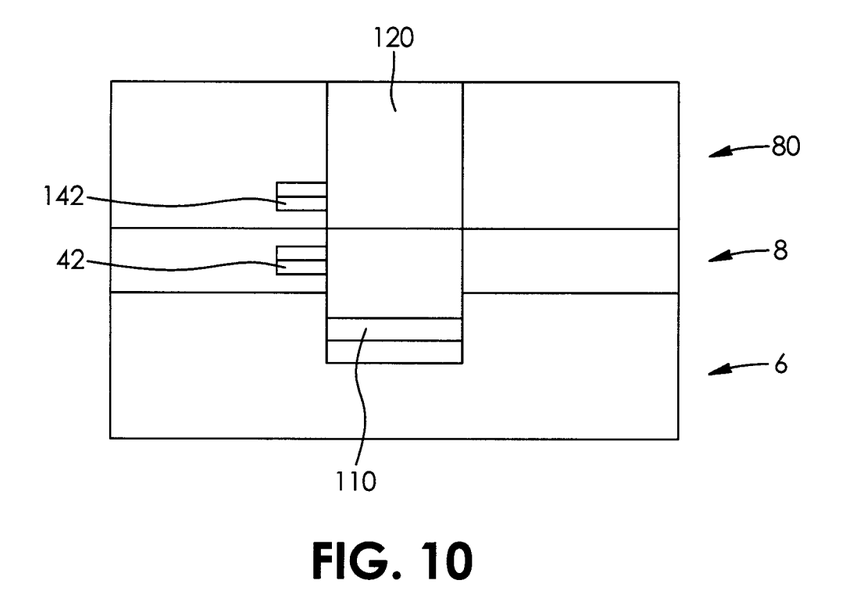
FIG. 10 is a side view of the second semiconductor structure with the second via filled.

As shown in FIG. 10, conductive material is deposited in the via 110 to form a via structure 120 or interconnection, thereby electrically interconnecting the conductive layers 40, 42, 142 to one another. The conductive material may be formed of tungsten, tungsten-based alloy, titanium, copper, or copper-based alloy, aluminum, gold, silver, molybdenum (Mo), titanium nitride (TiN), and the like. In the preferred embodiment, titanium, titanium nitride and tungsten are used and the via structure 120 is processed using a Tungsten Chemical Mechanical Planarization ("CMP") process and etch processing. Those skilled in the art would recognize that once the via structure 120 is established, there is electrical contact to the silicon through the third metal stack 88 in the third device layer 82. Sometimes this contact is desired, and sometimes electrical isolation will be required.

Figure 11:
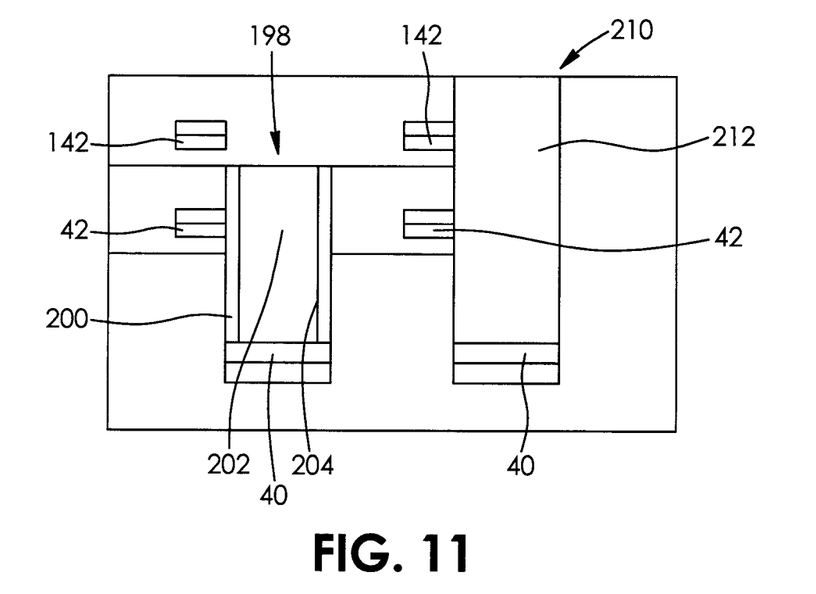
FIG. 11 is a semiconductor with vias extending through different transfer wafers.

As shown in FIG. 11 a first via, generally referred to as 198, is produced by a first etch step that self-aligns conductive layer 40 and 42. This via 198 is lined with an insulating layer 200 that is between the via structure 202 and the via wall 204. A second via, generally referred to as 210, is produced by a second etch step that self-aligns conductive layers 40, 42 and 142. This via 210 may or may not be lined with an insulating layer. The second via 210, by means of the via structure 212 self-aligns all three conducting layers 40, 42 and 142 in a single step.

Regardless of the number of transfer layers added, a finishing step in manufacturing involves passivation of the surface using various oxides and nitrides in a number of layers. The layers are each in the range of 1 μm. Without being bound to theory, this passivation protects the semiconductor from environment effects. This is followed by patterning with a "pad open" mask and etching of the passivation through to the metal stack 22, 88. After etching, the metal stack 22, 88 is available for wire bonds, bump bonds or any other standard die/packaging level connection technology including but not limited to redistribution layers (RDL) and other stacking technologies.

As would be known to one skilled in the art, additional transfer layers may be added, as described for the second transfer layer addition. All processes used are room temperature processes. The vias and via structures are about 250 nanometers to about 750 nanometers in diameter and all ranges therebetween. The vias and via structures are at a very high density with a relationship as low as 1 microelectronic element per via.

While example embodiments have been described in connection with what is presently considered to be an example of a possible most practical and/or suitable embodiment, it is to be understood that the descriptions are not to be limited to the disclosed embodiments, but on the contrary, is intended to cover various modifications and equivalent arrangements included within the spirit and scope of the example embodiment. Those skilled in the art will recognize or be able to ascertain using no more than routine experimentation, many equivalents to the specific example embodiments specifically described herein. Such equivalents are intended to be encompassed in the scope of the claims, if appended hereto or subsequently filed.

The invention claimed is:

1. A method of interconnecting metallic structures in the manufacture of a three-dimensional semiconductor structure, the method comprising providing a first upper surface of a first substrate and a second upper surface of a second substrate with a bonding layer; bonding the first upper surface to the second upper surface to provide a bond; etching a via through a lower surface of the first substrate, through the first substrate, adjacent to and in contact with a first metallic structure embedded in the first substrate, through the bond and to a second metallic structure embedded in the second substrate; and filling the via with a conductive material to provide a via structure, thereby electrically connecting the metallic structures.

2. The method of claim 1, further comprising an etch stop in the first metallic structure protecting a conductive layer in the first metallic structure from being etched.

3. The method of claim 2, further comprising an etch stop in the second metallic structure.

4. The method of claim 3, wherein the etching provides a via of less than about 500 nanometres in diameter.

5. The method of claim 4, further comprising bonding a third substrate to the lower surface of the first substrate to provide a second bond.

6. The method of claim 5, further comprising etching a second via through the third substrate, adjacent to and in contact with a third metallic structure embedded in the third substrate, and through the second bond to the via structure.

7. The method of claim 6, further comprising filling the second via with a conductive material to extend the via structure, thereby electrically connecting the metallic structures.

8. The method of claim 7, further comprising, in order, bonding, etching a via and filling the via in a fourth and subsequent substrates, thereby providing a three-dimensional semiconductor structure of n substrates, where n is the total number of substrates.

9. The method of any one of claims 2 to 8, wherein the method is conducted at room temperature.

10. The method of claim 9, wherein the bonding is oxide bonding.

11. A method of connecting substrates in the manufacture of a three-dimensional semiconductor structure, the method comprising: selecting a first substrate with a first upper surface and a first metallic structure below the first upper bottom; selecting a second substrate with a second upper surface and a second metallic structure below the second upper surface, the first metallic structure comprising a conductive layer proximate the first upper surface and an etching stop distal to the first upper surface and a second metallic structure comprising a conductive layer distal to the second upper surface and an etching stop proximate the second upper surface; providing the first upper surface and the second upper surface with a bonding layer; bonding the bonding layers to provide a bond; etching a via through a lower surface of the first substrate, through the first substrate, adjacent to and in contact with the first metallic structure, through the bond and to the second metallic structure; and filling the via with a conductive material to provide a via structure.

12. The method of claim 11, wherein the etching produces vias of less than about 750 nm in diameter.

13. The method of claim 12, wherein the etching produces vias of less than about 250 nm in diameter.

14. The method of claim 13, further comprising bonding a third substrate to the lower surface of the first substrate to provide a second bond.

15. The method of claim 14, further comprising etching a second via through the third substrate, adjacent to and in contact with a third metallic structure embedded in the third substrate, and through the second bond to the via structure.

16. The method of claim 15, further comprising filling the second via with a conductive material to extend the via structure, thereby electrically connecting the metallic structures.

17. The method of any one of claims 10 to 16, further comprising etching a plurality of vias in each of the substrates and filling the plurality of vias with the conductive material.

18. The method of claim 17, wherein the etching produces the plurality of vias at a concentration of about one via per microelectronic element.

19. A method of forming a three-dimensional semiconductor structure, the method comprising: selecting a first silicon wafer which includes a first device layer and a back-end-of-line (BEOL) layer, the BEOL layer including a first upper surface and a first metal stack, the first metal stack including a conductive layer proximate the first upper surface and an etching stop distal to the first upper surface, the first upper surface provided with an oxide layer; selecting a transfer layer which includes a second device layer and a second BEOL layer, the second BEOL layer including a second upper surface and a second metal stack, the second metal stack including a conductive layer proximate the second upper surface and an etching stop distal to the second upper surface, the second upper surface provided with an oxide layer; bonding the first silicon wafer to the transfer layer with the oxide layers, such that the first upper surface faces the second upper surface; etching a plurality of vias through the transfer layer into the first BEOL layer to a depth of the first metal stack; filling the vias with a conductive material, which facilitates an electrical connection between the first and the second metal stacks, thereby forming a three-dimensional semiconductor structure.

20. The method of claim 19, wherein the first silicon wafer is selected to have the first metal stack about 5 nm from the first upper surface and the transfer layer is selected to have the second metal stack about 5 nm from the second upper surface.

21. The method of claim 19 or 20, further comprising etching a plurality of vias in the substrates and filling the plurality of vias with the conductive material.

22. The method of claim 21, wherein the etching produces the plurality of vias at a concentration of about one via per microelectronic element.

23. The method of claim 22, wherein the etching produces vias of less than about 250 nanometres in diameter.

* * * * *